United States Patent
Papasouliotis et al.

(10) Patent No.: US 8,728,587 B2
(45) Date of Patent: May 20, 2014

(54) CLOSED LOOP PROCESS CONTROL OF PLASMA PROCESSED MATERIALS

(75) Inventors: George Papasouliotis, North Andover, MA (US); Deven M. Raj, Middleton, MA (US); Harold Persing, Westbrook, ME (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 127 days.

(21) Appl. No.: 13/168,649

(22) Filed: Jun. 24, 2011

(65) Prior Publication Data

US 2012/0328771 A1    Dec. 27, 2012

(51) Int. Cl.
C23C 14/28 (2006.01)
H05H 1/24 (2006.01)

(52) U.S. Cl.
USPC .................. 427/569; 427/9; 427/10

(58) Field of Classification Search
USPC ........................... 427/569, 8, 9, 10
See application file for complete search history.

(56) References Cited

U.S. PATENT DOCUMENTS

| | | | |
|---|---|---|---|
| 6,101,971 A | 8/2000 | Denholm et al. | |
| 7,586,100 B2 | 9/2009 | Raj et al. | |
| 2003/0157242 A1 | 8/2003 | Nakano et al. | |
| 2004/0037973 A1* | 2/2004 | Li et al. | 427/576 |
| 2005/0260837 A1 | 11/2005 | Walther et al. | |
| 2006/0032073 A1* | 2/2006 | Kato et al. | 34/92 |
| 2006/0088655 A1* | 4/2006 | Collins et al. | 427/8 |
| 2006/0284114 A1 | 12/2006 | Olson et al. | |
| 2007/0224840 A1 | 9/2007 | Renau et al. | |
| 2008/0188013 A1 | 8/2008 | Cho et al. | |
| 2008/0245957 A1 | 10/2008 | Gupta et al. | |
| 2008/0289576 A1* | 11/2008 | Lee et al. | 118/723.1 |
| 2009/0065145 A1* | 3/2009 | Aramaki et al. | 156/345.27 |
| 2009/0104719 A1* | 4/2009 | Gupta et al. | 438/7 |
| 2009/0104761 A1 | 4/2009 | Jeon et al. | |
| 2009/0200461 A1* | 8/2009 | Raj et al. | 250/287 |
| 2009/0202720 A1* | 8/2009 | Miyatani | 427/248.1 |

FOREIGN PATENT DOCUMENTS

EP    1014422 A1    6/2000

OTHER PUBLICATIONS

Roy, F., et al., "Online system for temperature and accumulated dose control in plasma-based ion implantation". Review of Scientific Instruments 78, 023905 (2007), pp. 1-5.*
Wu, Z.W., et al., "Simulation and dose uniformity analysis of plasma based ion implantation". Journal of Physics D: Applied Physics 38 (2005) 4296-4301.*
Chen, A., et al., "Dose analysis of nitrogen plasma source ion implantation treatment of titanium alloys". J. Vac. Sci. Technol. B 12(2), Mar./Apr. 1994, pp. 918-922.*

* cited by examiner

Primary Examiner — Bret Chen

(57) ABSTRACT

A plasma processing apparatus and method are disclosed which improve the repeatability of various plasma processes. The actual implanted dose is a function of implant conditions, as well as various other parameters. This method used knowledge of current implant conditions, as well as information about historical data to improve repeatability. In one embodiment, a plasma is created, a first sensing system is used to monitor a composition of the plasma and a second sensing system is used to monitor a total number of ions implanted. Information about plasma composition and dose per pulse is used to control one or more operating parameters in the plasma chamber. In another embodiment, this information is combined with historical data to control one or more operating parameters in the plasma chamber. In another embodiment, the thickness of material on the walls is measured, and used to modify one or more operating parameters.

7 Claims, 6 Drawing Sheets

CLOSED LOOP PROCESS CONTROL OF PLASMA PROCESSED MATERIALS

BACKGROUND

A plasma processing apparatus generates a plasma in a chamber which can be used to treat a workpiece supported by a platen in a process chamber. In some embodiments, the chamber in which the plasma is generated is the process chamber. Such plasma processing apparatus may include, but not be limited to, doping systems, etching systems, and deposition systems. In some plasma processing apparatus, ions from the plasma are attracted towards a workpiece. In a plasma doping apparatus, ions may be attracted with sufficient energy to be implanted into the physical structure of the workpiece, e.g., a semiconductor substrate in one instance.

In other embodiments, the plasma may be generated in one chamber, which ions are extracted from, and the workpiece is treated in a different process chamber. One example of such a configuration may be a beam line ion implanter where the ion source utilizes an inductively coupled plasma (ICP) source. The plasma is generally a quasi-neutral collection of ions (usually having a positive charge) and electrons (having a negative charge). The plasma has an electric field of about 0 volts per centimeter in the bulk of the plasma.

Turning to FIG. 1, a block diagram of one exemplary plasma processing apparatus 100 is illustrated. The plasma processing apparatus 100 includes a process chamber 102 defining an enclosed volume 103. A gas source 104 provides a primary dopant gas to the enclosed volume 103 of the process chamber 102 through the mass flow controller 106. A gas baffle 170 may be positioned in the process chamber 102 to deflect the flow of gas from the gas source 104. A pressure gauge 108 measures the pressure inside the process chamber 102. A vacuum pump 112 evacuates exhausts from the process chamber 102 through an exhaust port 110. An exhaust valve 114 controls the exhaust conductance through the exhaust port 110.

The plasma processing apparatus 100 may further includes a gas pressure controller 116 that is electrically connected to the mass flow controller 106, the pressure gauge 108, and the exhaust valve 114. The gas pressure controller 116 may be configured to maintain a desired pressure in the process chamber 102 by controlling either the exhaust conductance with the exhaust valve 114 or a process gas flow rate with the mass flow controller 106 in a feedback loop that is responsive to the pressure gauge 108.

The process chamber 102 may have a chamber top 118 that includes a first section 120 formed of a dielectric material that extends in a generally horizontal direction. The chamber top 118 also includes a second section 122 formed of a dielectric material that extends a height from the first section 120 in a generally vertical direction. The chamber top 118 further includes a lid 124 formed of an electrically and thermally conductive material that extends across the second section 122 in a horizontal direction.

The plasma processing apparatus 100 further includes a source 101 configured to generate a plasma 140 within the process chamber 102. The source 101 may include a RF source 150 such as a power supply to supply RF power to either one or both of the planar antenna 126 and the helical antenna 146 to generate the plasma 140. The RF source 150 may be coupled to the antennas 126, 146 by an impedance matching network 152 that matches the output impedance of the RF source 150 to the impedance of the RF antennas 126, 146 in order to maximize the power transferred from the RF source 150 to the RF antennas 126, 146.

The plasma processing apparatus 100 may also include a bias power supply 190 electrically coupled to the platen 134. The plasma processing system 100 may further include a controller 156 and a user interface system 158. The controller 156 can be or include a general-purpose computer or network of general-purpose computers that may be programmed to perform desired input/output functions. The controller 156 may also include communication devices, data storage devices, and software. The user interface system 158 may include devices such as touch screens, keyboards, user pointing devices, displays, printers, etc. to allow a user to input commands and/or data and/or to monitor the plasma processing apparatus via the controller 156. A shield ring 194 may be disposed around the platen 134 to improve the uniformity of implanted ion distribution near the edge of the workpiece 138. One or more Faraday sensors such as Faraday cup 199 may also be positioned in the shield ring 194 to sense ion beam current. In some embodiments, the Faraday cup 199 may be part of an independently controlled dose sensing system 197 (not shown).

The plasma processing apparatus 100 may also include an optical emission spectrometer (OES) 159. The OES 159 may be used to quantitively measure the wavelengths emitted by the plasma. As atoms become excited, their electrons move from a normal energy level to an excited energy level. Each species of atom has specific energy levels (excited and normal). As an electron of a particular species moves between these specified energy levels, it emits a specific wavelength of energy, much of which is in the visible spectrum. The OES 159 is used to measure these wavelengths and the number of occurrences of each. Based on this data, it is possible to determine which atoms are being ionized, and the relative concentration of each species in the plasma. This information can be transmitted to the controller 156. In some embodiments, the controller 156 may modify various parameters to adjust this measured concentration of ions. In some embodiments, the OES 159 includes an independent controller. In this embodiment, the OES 159 may be used to validate that the ion concentrations within the plasma are within specified levels.

In operation, the gas source 104 supplies a primary dopant gas containing a desired dopant for implantation into the workpiece 138. The source 101 is configured to generate the plasma 140 within the process chamber 102. The source 101 may be controlled by the controller 156. To generate the plasma 140, the RF source 150 resonates RF currents in at least one of the RF antennas 126, 146 to produce an oscillating magnetic field. The oscillating magnetic field induces RF currents into the process chamber 102. The RF currents in the process chamber 102 excite and ionize the primary dopant gas to generate the plasma 140.

The bias power supply 190 provides a pulsed platen signal having a pulse ON and OFF periods to bias the platen 134 and hence the workpiece 138 to accelerate ions 109 from the plasma 140 towards the workpiece 138. The ions 109 may be positively charged ions and hence the pulse ON periods of the pulsed platen signal may be negative voltage pulses with respect to the process chamber 102 to attract the positively charged ions. The frequency of the pulsed platen signal and/or the duty cycle of the pulses may be selected to provide a desired dose rate. The amplitude of the pulsed platen signal may be selected to provide a desired energy. Monitors, such as the OES 159 and the Faraday cups 199, may be used to monitor ion concentration and dosage, respectively.

One drawback of conventional plasma processing is the inability to insure repeatability, such as of the resistance of contacts using diborane ($B_2H_6$) for the presilicidation implant. The contact resistance, which is measured ex-situ, post process, has been found to be a function of at least three parameters. The first parameter is the implant order, where wafers that are processed earlier have a greater resistance than those processed later. The second parameter is the chamber history/wall coverage, which represents the amount of material that has become embedded in the walls of the chamber since last cleaning. The third parameter is the implant conditions, such as plasma chemistry, RF power, gas pressure, platen voltage, total ion dose. This third parameter can be specified in the inputs to the process tool (process recipe) and its effects on plasma conditions (properties and composition) can be measured in-situ, in real time, using the monitors described above. However, the other two parameters are not easily measured, and therefore are typically not used to determine implant parameters in real time. Thus, there is still variability between wafers, despite monitoring of implant conditions. Accordingly, there is a need for a plasma processing method that overcomes the above-described inadequacies and shortcomings.

SUMMARY

A plasma processing apparatus and method are disclosed which improve the repeatability of various plasma processes. The actual implanted dose is a function of implant conditions, as well as various other parameters. This method used knowledge of current implant conditions, as well as information about historical data to improve repeatability. In one embodiment, information about plasma composition and dose per pulse is used to control one or more operating parameters in the plasma chamber. In another embodiment, this information is combined with historical data to control one or more operating parameters in the plasma chamber.

BRIEF DESCRIPTION OF THE DRAWINGS

For a better understanding of the present disclosure, reference is made to the accompanying drawings, in which like elements are referenced with like numerals, and in which.

DETAILED DESCRIPTION

As described above, traditional PLAD systems may use in situ monitoring to process substrates. These systems are used to monitor one or more operating characteristics. In some embodiments, the PLAD system monitors plasma composition, such as through the use of an optical emission spectrometry system 159. In other embodiments, the PLAD system monitors the total dose, or dose per pulse using a dose sensing system 197. In yet other embodiments, both of these systems are used, allowing the controller to have information about the composition of the plasma, as well as the amount of dose being applied to the substrate. Other operating characteristics may also be monitored instead or, or in addition to, these characteristics.

Figure 1:
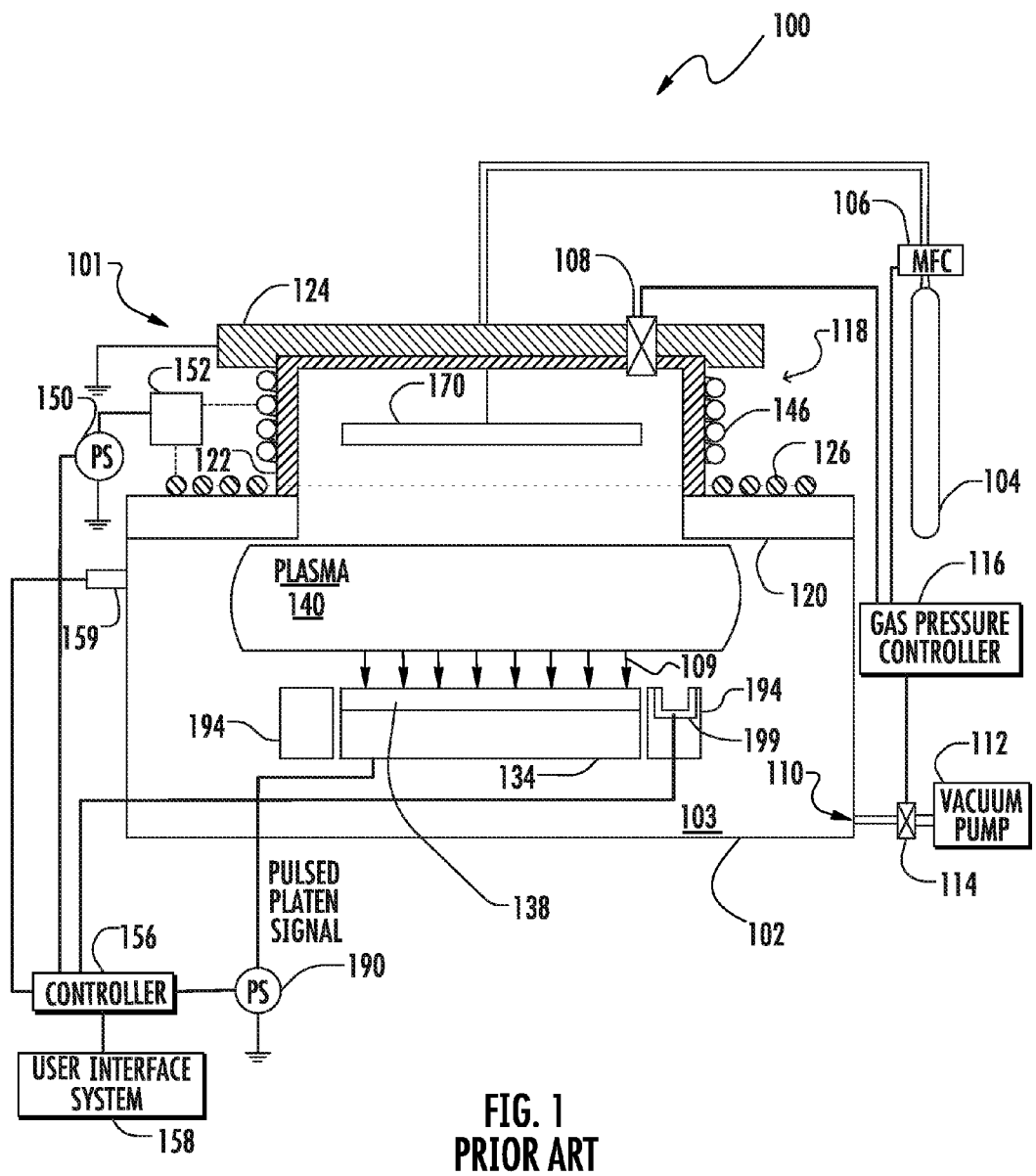
FIG. 1 is a block diagram of a plasma processing apparatus of the prior art.
Figure 2:
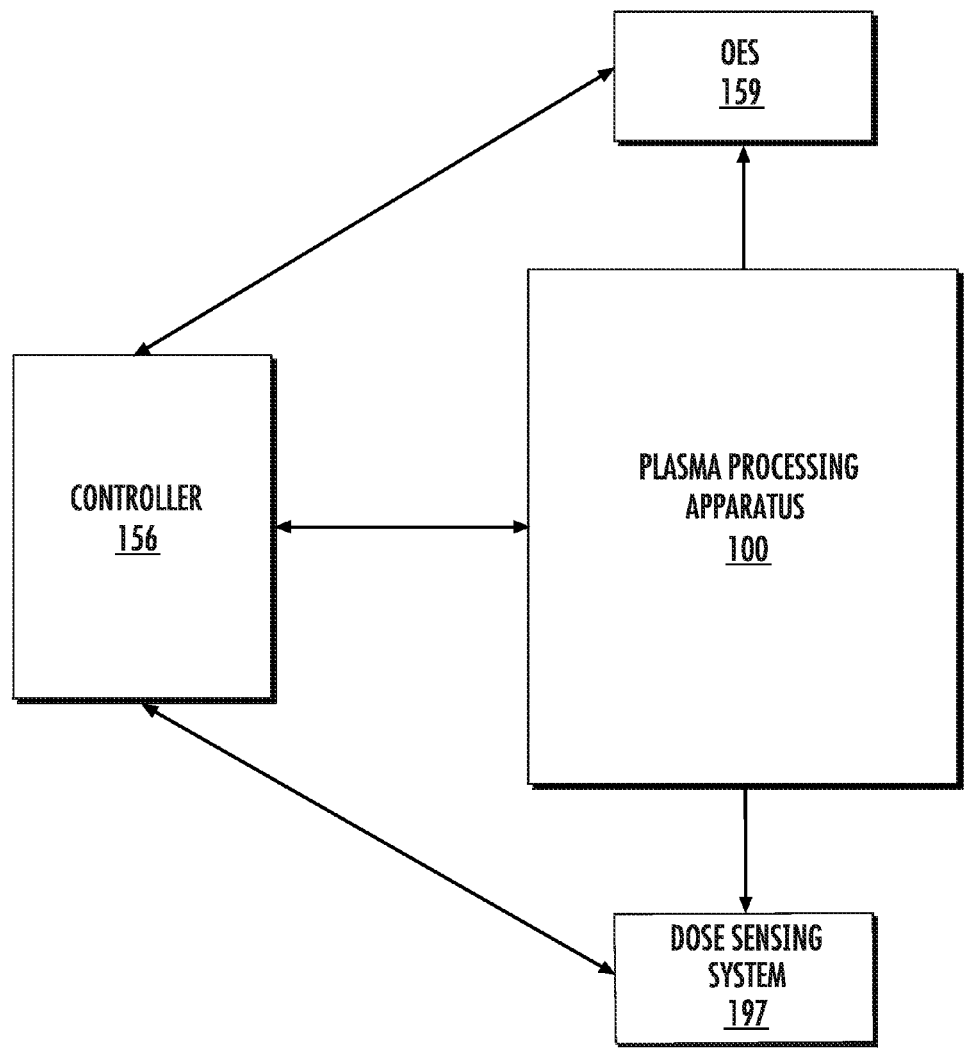
FIG. 2 illustrates a representative control loop for a plasma processing apparatus of the prior art.

FIG. 2 shows an illustration of the interaction between various components of the plasma processing system. As described above, the OES 159 is used to measure the wavelengths emitted from the plasma produced in the plasma processing apparatus 100. This information is transmitted from the OES 159 to the controller 156. In addition, in some embodiments, the controller 156 may communicate with the OES 159. For example, the controller may set limits for each wavelength and the OES 159 may only supply a pass/fail indication. Similarly, a dose sensing system 197 is used to measure the dose being implanted in the substrate. This information is also transmitted to the controller 156. Therefore, using the OES 159 and the dose sensing system 197, the controller 156 can determine the composition of the plasma, as well as the number of ions that are being implanted in the substrate. In addition, in some embodiments, the controller 156 may communicate with the dose sensing system 197. For example, the controller may set limits for the dose and the dose sensing system 197 may only supply a pass/fail indication. The controller 156 also communicates with the plasma processing apparatus 100, such as regulating gas pressure, RF power, platen voltage, or other parameters. Note that in this model, the controller utilizes data that can be measured in real time in-situ, but uses no other information in controlling the plasma processing apparatus 100.

In one embodiment, the controller 156 uses information from the OES 159 to determine the composition of the plasma, and information from the dose sensing system 197 to determine the number of ions being implanted into the substrate. By using both these values, the controller 156 may determine the number of ions of interest that are being implanted. For example, assume that the OES 159 determines that 75% of the ions are boron and 25% are hydrogen. The dose sensing system 197 then determines the total number of ions being implanted during each pulse. Assuming that, of the total number of ions, 75% are boron, the controller 156 may better predict and control the implanted dose in the substrate. In some embodiments, the composition of the plasma may vary over time. By using both the composition of the plasma and the total ions implanted, more uniform and repeatable doping may be achieved.

Although the disclosure describes optical emission spectrometry as the method of determining plasma composition, other methods may also be used. For example, systems such as mass spectrometry and the "Hercules Probe", may also be used to determine plasma composition.

Figure 3A:
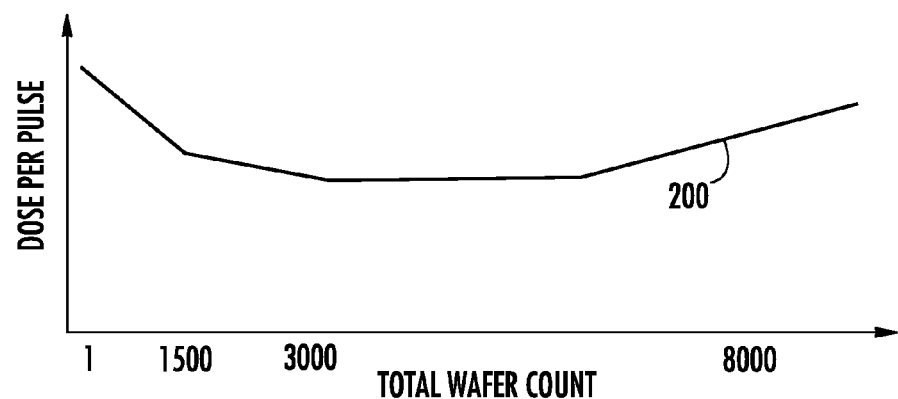
FIGS. 3A-B illustrate representative outputs from various sensing systems as a function of wafer count.

However, it has also been determined that these in situ parameters may not provide all of the information necessary to insure uniform doping. For example, FIG. 3A shows a graph showing the dose per pulse (DPP) output 200 of the dose sensing system 197 as a function of total wafer count. In this graph, it is assumed that the PLAD chamber was cleaned prior to wafer 1, and is not cleaned again for the duration of this graph. This graph shows that the dose per pulse 200 decreases sharply for each of the first 1500 wafers, and then gradually decreases for the next 1500 wafers. The DPP 200 remains relatively constant until about wafer 6000, when the dose per pulse 200 begins increasing again.

Figure 3B:
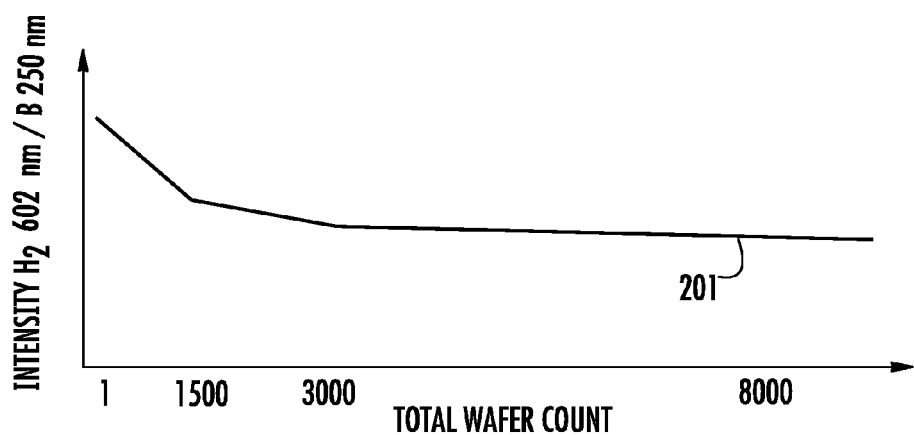

FIG. 3B is a graph showing the intensity 201 of the plasma, as measured as a ratio of hydrogen ionization to boron ionization. Larger values of intensity 201 indicate a higher proportion of hydrogen in the plasma. Again, the intensity 201 decreases sharply for the first 1500 wafers, and then gradually decreases for the next 1500 wafers. The intensity 201 remains relatively constant for the duration of the graph.

Based solely on these operating characteristics, various conclusions may be drawn. First of all, the composition of the plasma, as shown in graph 201, especially immediately after the cleaning of the chamber, suggests that the doses being implanted are high in hydrogen ions. This will likely increase the contact resistance. Second, the dose per pulse 200 and intensity 201 both remain relatively constant from wafers 3000 to 6000. Therefore, the contact resistance would be assumed to be constant during this range as well. Third, near the end of the graphs, the plasma composition 201 remains constant, while the dose per pulse 200 increases.

Figure 4:
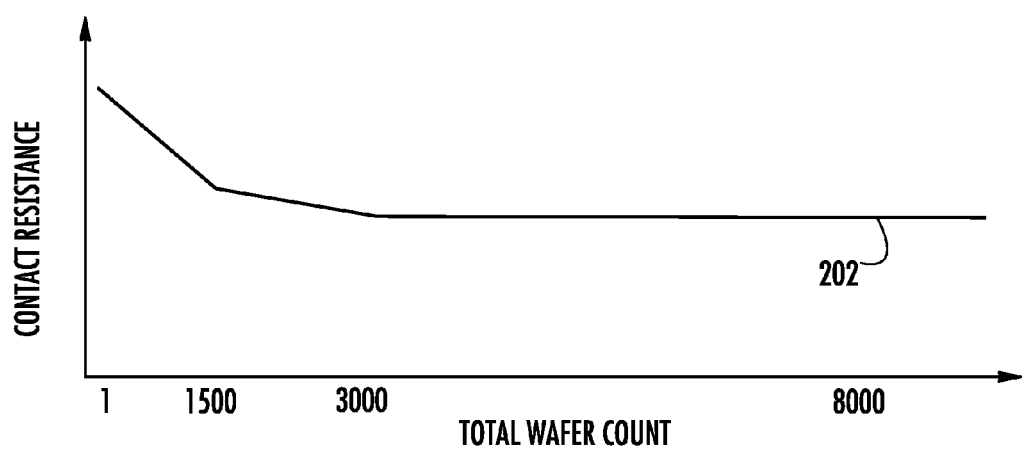
FIG. 4 shows a representative graph showing actual contact resistance, measured post process as a function of wafer count.

Semiconductor manufacturers often monitor quality and performance parameters after a process is completed. For example, an operator may conduct ex situ tests to determine actual dosage applied to a substrate, or the contact resistance of the substrate. Historical data are the results of design of experiments (DOE's) and process sensitivity. When a technology is qualified, test lots are processed to determine process space and sensitivity. The results from these experiments can be used to adjust process parameters at a future point. FIG. 4 shows a graph of the actual measured contact resistance 202 as a function of wafer count.

As expected, the contact resistance 202 soon after a chamber cleaning is higher. Thus, beam intensity 201 appears to be a fairly accurate predictor of contact resistance 202. However, the contact resistance 202 remains almost flat from wafer 3000 to the end, while the dose per pulse 200 (FIG. 3A) shows a definite increase in dose after wafer 6000. In other words, the contact resistance 202 remains flat, while the dose being implanted per pulse increases. Such an effect is not obvious based solely on the dose 200 and intensity 201 graphs. In other words, a function utilizing only in situ parameters may not be able to accurately predict the actual measured contact resistance 202.

Thus, other factors, besides those which can be measured in situ, must be considered and evaluated if the contact resistance of the substrate is to remain constant, across a large number of substrates.

For example, it is known that the contact resistance and other semiconductor parameters may be affected by chamber conditions. After a PLAD chamber has been cleaned, all material has been removed from the walls. However, after the processing of each substrate, material begins to build up on the sidewalls. Therefore, the thickness of material on the walls may be related to the number of substrates that have been processed since the last time the PLAD chamber was cleaned. This buildup of material on the PLAD chamber walls may impact the actual implant of ions into the substrate in a way that is not easily determined based exclusively on in situ monitoring.

Therefore, a historical parameter, such as but not limited to the wafer count since the last chamber cleaning, may be used, in conjunction with in situ parameters, to adjust the operating parameters of the PLAD chamber. In the above example, based on the in situ parameters and the wafer count, the controller 156 may adjust operating parameters to create a uniform contact resistance across the entire wafer count.

Immediately after cleaning, the controller 156, based on historic data, may determine that the plasma composition must be adjusted. This may be done by modifying the RF power, for example. In another embodiment, the controller 156 may vary the gas mix so as to increase the percentage of boron in the gas. Other operating parameters are also possible; this list only intends to illustrate possible adjustments that may be made based on the incorporation of historical data.

After wafer 3000, the controller 156 may utilize only the in situ data, as the contact resistance 202 appears to correlate well with these parameters. In other embodiments, these in situ parameters are adjusted to compensate for historical variations.

After wafer 6000, the controller 156 may increase the dose per pulse 200 to insure that the contact resistance 202 remains constant. This may be done by varying the pulse mode of the bias pulse, or increasing the plasma density by varying the RF power. Again, other modifications are also possible.

Figure 5:
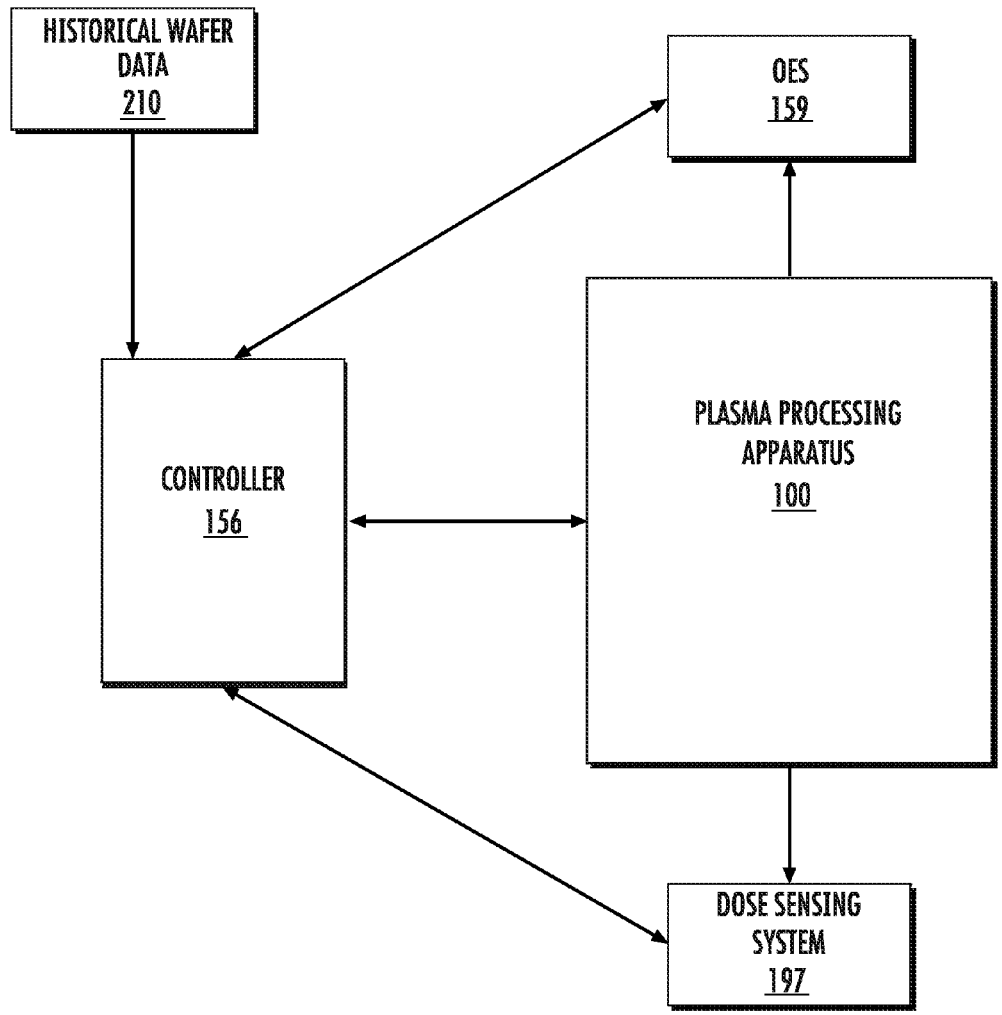
FIG. 5 illustrates a representative control loop for a plasma processing apparatus.

FIG. 5 shows a modified control loop according to one embodiment. As explained with respect to FIG. 2, the controller 156 may utilize information from one or more in situ monitoring or sensing system, such as but not limited to OES 157 or dose sensing system 197. In addition, the controller 156 has access to historical data 210. This historical data may be in a variety of forms. In one embodiment, the historical data is converted to an equation or a table of adjustment values, which is then applied to the control loop being performed by the controller 156. For example, the controller 156 may calculate the various operating parameters, such as RF power, bias pulse duration, total dose, and others, based on the in situ parameters. The historical data may then be incorporated as an adjustment to one or more of these operating parameters. Other methods of incorporating this historical data are also possible and within the scope of this disclosure.

In one particular example, the historical data represents the wafer count since the last cleaning. Adjustment values are compiled for one or more operating parameters, such as RF power, bias pulse width, and others. In one embodiment, for each operating parameter which is to be adjusted, a table is created, where the index into the table is the wafer number and the value in the table is the adjustment to be applied to the computed operating parameters.

Figure 6:
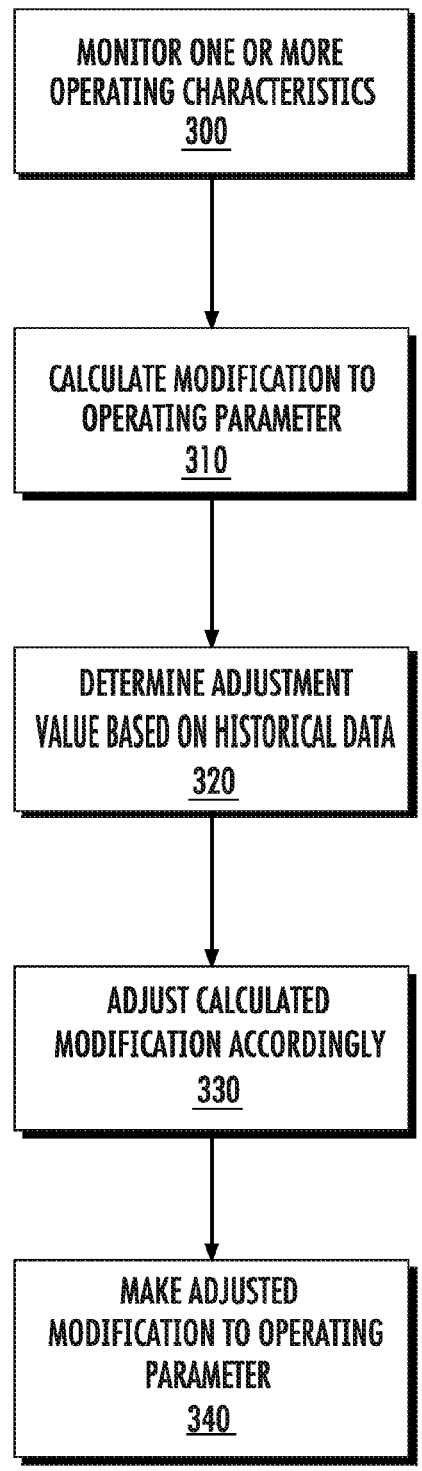
FIG. 6 illustrates a process to modify an operating parameter.

FIG. 6 shows one possible embodiment. As an example, the controller 156 may monitor operating characteristics using the OES 157 and dose sensing sensor system 197, as shown in step 300. The controller then determines that a particular operating parameter needs to be modified and calculates the modification, as shown in step 310. Before making that modification, the controller 156 indexes into the historical data table for this particular operating parameter, using the wafer count as an index, and finds an adjustment value, as shown in step 320. The controller 156 then incorporates that adjustment value into the calculated modification, as shown in step 330. The controller 156 makes the resulting change to the operating parameter, as shown in step 340. This process can be repeated for any number of operating parameters. As noted above, a table is not the only method that can be used to adjust the calculated modification. In other embodiments, an equation may be applied, which incorporates the operating characteristics and the historical data.

Above, the historical data is described as related to wafer count since the last cleaning. However, other forms of historical data may also be used. This data may be process sensitivity data, design of experiments, or electrical performance data relative to integrated dose and chamber condition. In all cases, this historical data is combined with the in situ operating conditions to determine the appropriate operating parameters.

In another embodiment, the amount of material deposited on the chamber walls is used as an input to the controller 156. The above description showed the variation of contact resistance as a function of number of wafers since last cleaning. A similar correlation may be created between the thickness of material on the chamber walls and the contact resistance. In this embodiment, the amount of material on the chamber walls may be empirically measured, such as with an optical method. Thus, in addition to knowing the plasma composition and dose implanted, the controller 156 would also be aware of the material thickness. This parameter may be used to adjust operating parameters, as explained above.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of implanting ions of a desired species into a substrate in a plasma processing chamber, comprising:
   creating a plasma using a set of operating parameters;
   measuring a thickness of material on a wall of said chamber;
   biasing said substrate so as to attracts ions from said plasma toward said substrate;
   utilizing a first sensing system to monitor a composition of said plasma in said chamber;
   utilizing a second sensing system to monitor a total number of ions implanted into said substrate;
   determining, based on said composition and said total number of ions, a number of ions of said desired species being implanted into said substrate; and
   terminating said biasing when said number of ions of said desired species reaches a predetermined threshold, wherein said predetermined threshold or at least one of said operating parameters is modified based on said measured thickness of material.

2. The method of claim 1, wherein said first sensing system comprises an optical emission spectrometry system.

3. The method of claim 1, wherein said second sensing system comprises a faraday cup.

4. The method of claim 1, wherein said composition comprises a percentage of ions in said plasma of said desired species, and said number of ions of said desired species comprises said percentage multiplied by said total number of ions.

5. The method of claim 1, further comprising using historical data to modify said predetermined threshold.

6. The method of claim 1, further comprising using historical data to modify at least one of said operating parameters.

7. The method of claim 1, wherein said predetermined threshold and said operating parameters are selected to create a uniform contact resistance across a plurality of substrates.

* * * * *